United States Patent [19]

Kapon et al.

[11] Patent Number: 5,086,430
[45] Date of Patent: Feb. 4, 1992

[54] PHASE-LOCKED ARRAY OF REFLECTIVITY-MODULATED SURFACE-EMITTING LASERS

[75] Inventors: Elyahou Kapon; Meir Orenstein, both of Old Bridge, N.J.

[73] Assignee: Bell Communications Research, Inc., Livingston, N.J.

[21] Appl. No.: 628,571

[22] Filed: Dec. 14, 1990

[51] Int. Cl.$^5$ ............................................. H01S 3/19
[52] U.S. Cl. ...................................... 372/50; 372/45; 372/46
[58] Field of Search ............................... 372/45, 46, 50

[56] References Cited

U.S. PATENT DOCUMENTS 4,949,350 8/1990 Jewell et al. ........................... 372/45

OTHER PUBLICATIONS

M. orenstein et al., "Lateral Definition of High Performance Surface Emitting Lasers by Planarity Preserving Ion Implantation Processes," CLEO Conference Proceedings, May 21-25, 1990, pp. 504-505.

M. Orenstein et al., "Vertical-Cavity Surface-Emitting InGaAs/GaAs Lasers with Planar Lateral Definition," *Applied Physics Letters*, vol. 56, pp. 2384-2386, Jun. 11, 1990.

H. J. Yoo et al., "Fabrication of a Two-Dimensional Phased Array of Vertical-Cavity Surface-Emitting Lasers," *Applied Physics Letters*, vol. 56, pp. 1198-1200, Mar. 26, 1990.

H. J. Yoo et al., "Array Mode Analysis of Two-Dimensional Phased Arrays of Vertical Cavity surface Emitting Lasers," *IEEE Journal of Quantum Electronics*, vol. 26, pp. 1039-1051, Jun. 6, 1990.

D. G. Deppe et al., "Phase-Coupled Two-Dimensional $Al_xGa_{1-x}A$-GaAs Vertical-Cavity Surface-Emitting Laser Array," *Applied Physics Letters*, vol. 56, pp. 2089-2091, May 21, 1990.

Y. H. Lee et al., "Room-Temperature Continuous Wave Vertical-Cavity Single-Quantum-Well Microlaser Diodes," *Electronics Letters*, vol. 25, pp. 1377-1378, Sep. 28, 1989.

M. Oresntein et al., "Phase Locking of Two-Dimensional Vertical Cavity Semiconductor Laser Arrays with Dynamic Mode Control," Technical Digest of CLEO 1990, Postdeadline paper CPDP29-1, pp. 665-666, May 21-25, 1990.

M. Orenstein et al., "Effects of Array Geomery on the Supermodes of 2-Dimensional Vertical Cavity Semiconductor Laser Arrays," *Technical Digest of the LEOS 1990 Annular Meeting, Boston, MA*, paper SDL1.2/MKK7, Nov. 4-9, 1990.

M. Taneya et al., "Stable Quasi 0° Phase Mode Operation in a Laser Array Diode Nearly Aligned with a Phase Shifter," *Applied Physics Letters*, vol. 50, pp. 783-785, Mar. 30, 1987.

M. Orenstein et al., "Planar 2-Dimensional Arrays of Coherently Locked Vertical Cavity Surface Emitting InGaAs/GaAs Laserlet Arrays," Proceedings of the 48th Annual Device Research Conference, Jun. 25-27, 1990, Santa Barbara, California, Paper VIIIA-4.

*Primary Examiner*—Georgia Epps
*Attorney, Agent, or Firm*—Leonard Charles Suchyta; Charles S. Guenzer

[57] ABSTRACT

A method of fabricating an array of vertical-cavity, surface-emitting lasers that allows the lasers to be phase-locked and the resulting device. The growth of the laterally unpatterned epitaxial vertical-cavity structure includes an upper mirror which is only partially reflective. A gold layer supplies the final reflectivity. A grip pattern is then etched in the gold layer, and a lower reflectivity metal layer is deposited over the gold layer and into the grid. The lower reflectivity metal both provides a common contact to the laser elements but also degrades the mirror reflectivity in the grid portion. The lower reflectivity prevents the grid portion from lasing. The areas within the grid pattern are separate lasers, but they are so closely separated that they lase coherently among themselves.

12 Claims, 3 Drawing Sheets

PHASE-LOCKED ARRAY OF REFLECTIVITY-MODULATED SURFACE-EMITTING LASERS

FIELD OF THE INVENTION

The invention generally relates to surface emitting lasers. In particular, the invention relates to arrays of vertical-cavity, surface-emitting lasers defined by reflectivity variations.

BACKGROUND ART

The first sizable array of vertical-cavity, surface-emitting lasers was disclosed by Jewell et al. in U.S. Pat. No. 4,949,350. They first grew a vertical-cavity Fabry-Perot resonator structure on a substrate. The initial structure was laterally undefined. Vertically, it consisted of upper and lower interference mirrors separated by an optical distance equal to the lasing wavelength. The mirrors sandwiched an active layer of several quantum well layers, which emitted light at the lasing wavelength when current was passed through them. All the layers were III-V semiconductors epitaxially deposited by molecular beam epitaxy on the conductive GaAs substrate. The layers above the active region were p-type, while those below were n-type so as to form a laser diode. A layer of gold was then deposited over the upper mirror.

The laser array was then laterally defined by a photolithographic definition of a nickel mask above the intended lasers followed by chemically assisted, ion-beam etching. The ion-beam etching was carried through the entire vertical-cavity structure so as to create an array of pillars having heights of more than 5 $\mu$m. Each pillar was a separate laser and was electrically selected by contacting the metal at the top of the respective pillar. The conductive substrate served as a common counter electrode. Light was emitted through the substrate. Jewell et al. demonstrated their invention with lasers having diameters ranging down to 2 $\mu$m. Thus, it became possible to fabricate extremely dense arrays of lasers.

The pillar lasers of Jewell et al. suffer from several problems. Electrical contact needs to be made to the top of the high aspect-ratio pillars. For small pillar lasers, the relatively large sidewalls cause excessive recombination. Heat cannot be efficiently dissipated in the pillar structure. The sophisticated processing of Jewell et al. raises questions of manufacturability. They suggested planarization with polyimide which would maintain the index-guide optical waveguiding function and current confining function of the previously defined pillars and ease the contacting problem. Work is progressing on this approach and on regrowth with insulating AlGaAs, which would help solve the recombination and thermal dissipation problems, but the results are not totally satisfactory.

Orenstein et al. have disclosed a planarized array of vertical-cavity, surface-emitting lasers in U.S. patent application, Ser. No. 480,117, filed Feb. 14, 1990, in "Lateral definition of high performance surface emitting lasers by planarity preserving ion implantation processes," Conference Proceedings, CLEO, May 21-25, 1990, pages 504-505 and in "Vertical-cavity surface-emitting InGaAs/GaAs lasers with planar lateral definition," Applied Physics Letters, volume 56, 1990, pages 2384-2386. They grew the same vertical-cavity structure as in the Jewell et al. array. However, they performed the lateral definition by ion implanting protons in regions surrounding the intended lasers and extending down to just above the active layer. The protons reduced the conductivity of the implanted region. Thereby, current was guided through the laser area. Thus Orenstein et al. retained the current guiding of Jewell et al. but sacrificed their index guiding since the protons did not have a significant effect on the refractive index. The deep ion implantation of their technique places a lower limit on the size of the lasers and the separation between lasers.

Although vertical-cavity, surface-emitting lasers provide the advantage of lasers of very small area and low threshold current, some applications require high optical power. In principle, a surface-emitting laser can achieve high-power by a simple increase in the cross-section of the lasing region with a constant current density. We have performed experiments that have demonstrated that this technique works only poorly. For larger sized surface-emitting lasers, the produced laser light is filamented into irregularly shaped and perhaps separated lasing areas. Similar filamentation has been observed in edge-emitting diode lasers due to inhomogeneities in the gain and refractive index distributions of the optical waveguides. For vertical-cavity diode lasers, filamentation may additionally arise from spatial variations in mirror reflectivities, which are above 99% because of the short gain length and high cavity finesse. The spatial variations are enough to induce lasing preferentially in some regions but not in others. A side from efficiency and thermal problems, the sparsely connected filaments are not likely to be phase-locked or even to have precisely the same frequency. That is, a large area surface-emitting laser tends to lose its laser characteristics. Furthermore, even medium sized lasers (~5-40 $\mu$m in diameter) are bound to oscillate in a large number of modes, the distribution of which is uncontrollable. Some applications need a single mode of high-power lasing light.

Yoo et al. have disclosed an array of small, phase-locked lasers in "Fabrication of a two-dimensional phased array of vertical-cavity surface-emitting lasers," Applied Physics Letters, volume 56, 1990, pages 1198-1200. In a refinement of the Jewell et al. technique, they fabricated a rectangular array of more than 160 lasers formed within a 25 $\mu$m circle. Each laser element had a square size of 1.3 $\mu$m and was separated from neighboring laser elements by less than 0.1 $\mu$m. The circular array was planarized with polyimide and a common upper electrode attached to all the lasers. The angular distribution of the far-field optical intensity showed substantial, though possibly not complete, phase locking between the lasers. Yoo et al. were able to achieve phase-locking between the strongly waveguiding pillars of Jewell et al. only by the very small separation between pillars and the small areas of the pillars. The calculations of Yoo et al. in "Array Mode Analysis of Two-Dimensional Phased Arrays of Vertical Cavity Surface Emitting Lasers," IEEE Journal of Quantum Electronics, volume 26, 1990, pages 1039-1051 have shown this requirement of small laser spacing for strongly waveguided structures. However, such a structure and associated processing produce very high surface recombination on the sides of the pillars because of the large surface-to-volume ratio. As a result, their phase-locked array showed poor efficiency and threshold current, and their phase locking was not complete.

Deppe et al. have disclosed another phase-locked surface-emitting laser array in "Phase-coupled two-dimensional $Al_xGa_{1-x}As$-GaAs vertical-cavity surface-emitting laser array," Applied Physics Letters, volume 56, 1990, pages 2089-2091. They stopped the epitaxial growth of the vertical cavity with the upper spacer. They then formed a 2 μm wide Mn-Al metallization grid on top of the upper spacer and an insulating dielectric stack on top of the grid-covered spacer. Lasing did not occur beneath the grid.

Phase-locked arrays of lasers present several unique applications. If the laser elements are phase locked with non-zero phase differences, the far-field intensity assumes a multi-lobed or at least off-axis pattern with the details of the patterns depending on the number of elements and the relative phase differences between the elements. If the phase differences are controlled, then the intensity pattern can be controlled.

SUMMARY OF THE INVENTION

Accordingly, an object of the invention is to provide a phase-locked array of vertical-cavity, surface-emitting lasers.

Another object of the invention is to provide a planarized array of such lasers.

It is a further object of the invention to control the phase differences of the elements of the array of lasers.

The invention can be summarized as an array of vertical-cavity, surface-emitting lasers in which separate lasers are defined by lateral variations in the reflectivity of the mirrors. For example, an upper interference mirror is only partially reflective in a laterally undefined vertical-cavity laser structure. A high-reflectivity metal covers the upper interference mirror only in the laser portions. A low-reflectivity metal is filled into the gaps of the high-reflectivity metal in the portions between the lasers.

DETAILED DESCRIPTION OF THE PREFERRED EMBODIMENT

Figure 1:
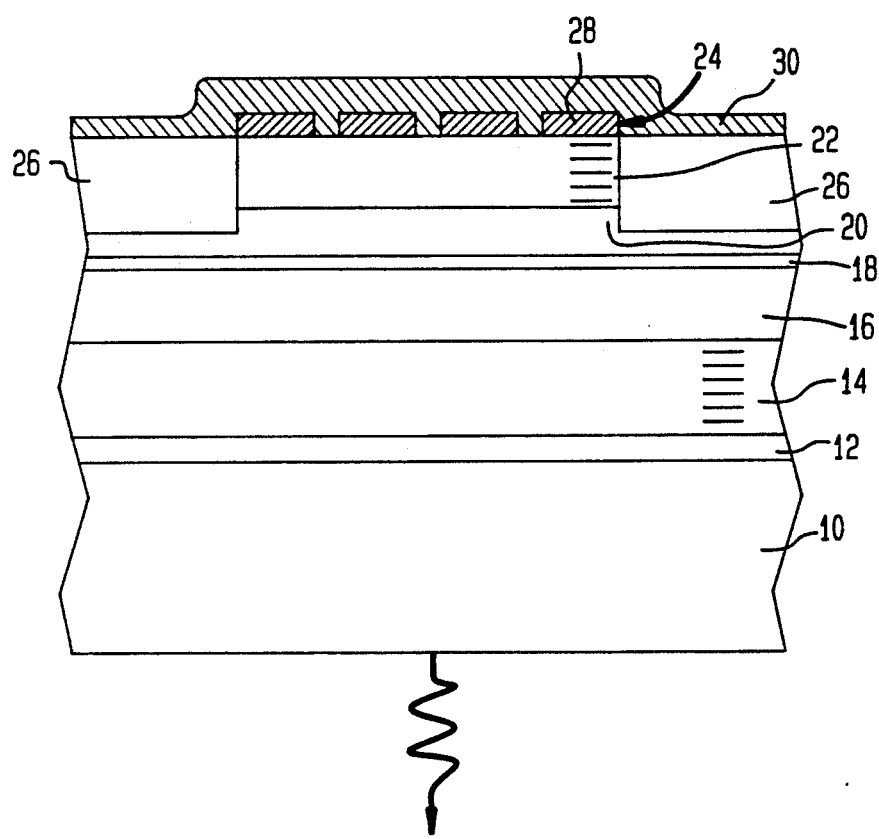
FIG. 1 is a cross-section of an embodiment of the present invention.

An embodiment of the present invention, illustrated in cross-section in FIG. 1, includes a two-dimensional array of vertical-cavity, surface-emitting lasers in which the laser elements of the array are defined by loss modulation of the upper mirror.

A laterally undefined vertical-cavity laser structure based on InGaAs/GaAs was grown by molecular beam epitaxy, generally following the process disclosed by Jewell et al. but using many of the processing parameters disclosed in the Orenstein et al. patent. A semi-insulating GaAs wafer was used as a substrate 10 on which was deposited a n+ contact layer 12 of GaAs. This structure allows contact to the lower mirror to be made from above the substrate 10. Then there were grown an n-type lower interference mirror 14, an n-type lower spacer 16, an active layer 18, a p-type upper spacer 20, and a p-type upper interference mirror 22. Both the lower and upper mirrors 14 and 22 were composed of alternate quarter-wavelength λ/4 thick layers of AlAs and GaAs, where λ is the emitted laser wavelength of 958.8 nm. Interposed between the AlAs and GaAs layers were AlGaAs superlattices with graded Al concentrations in order to smooth out the layer interfaces, as has been disclosed by Lee et al. in "Room-temperature continuous-wave vertical-cavity single-quantum-well microlaser diodes," Electronics Letters, volume 25, 1989, pages 1377-1378. The lower mirror 14 comprised 20 pairs of AlAs/GaAs pairs; the upper mirror 22 had only 12 pairs in order to make it only partially reflecting. The active layer 18 was centered between the mirrors 14 and 22 and included three $In_{0.2}Ga_{0.8}As$ quantum wells, 8 nm thick and undoped. The quantum wells were separated by GaAs barrier layers, 10 nm thick and undoped. The active region was chosen such that it would emit at λ. The spacers 16 and 20 had thicknesses such that the mirrors were separated by an optical distance λ, so as to form a Fabry-Perot cavity. The contact layer 12, the bottom mirror 14, and the bottom spacer 16 were doped with Si to be n-type, while the top spacer 20 and top mirror 22 were doped with Be to be p-type. An unillustrated heavily doped p+-type layer of GaAs having a 10 nm thickness was the last semiconductor layer deposited on the top mirror 22.

A 300 nm thick gold layer 24 was deposited on the upper mirror 22 and photolithographically masked to define a broad laser area, e.g., 200×200 μm². The unmasked gold was removed by Ar+ ion milling (500 V, 0.25 A). The gold layer 24 serves both as part of the upper reflector and as the p-contact for the upper mirror 22. The same photoresist mask defining the gold layer 24 further served as an ion-implantation mask for the three-step proton implantation described in the Orenstein et al. references, which created an insulating region 26 surrounding the broad laser area. An alternate method for forming the insulating region 26 is to initially coat the substrate 10 with a $SiN_4$ layer, which is then removed in the broad area of the lasers. The subsequent growth of the vertical-cavity structure forms epitaxially in the opening but is polycrystalline over the $SiN_4$. The polycrystalline material electrically conducts much less than the epitaxial material and thus electrically isolates the broad laser area.

Another photolithographic step formed a photoresist mask which was, for example, a 2 μm wide rectangular grid between 7×7 μm² small-area lasers arranged in, for example a 20×20 two-dimensional array. Ion milling with Ar+ ions of 500 V at 0.25 A removed the exposed gold and formed individual gold mirror contacts 28. A metal layer 30 of 250 nm of Ti (or Cr) and 3000 nm of Au provided a laterally uniform current contact and also filled the strips between the mirror contacts 28. The Ti/Au or Cr/Au material has a lower reflectivity than Au so that a loss or reflectivity modulation arose between the gold contacts 28 and the Ti/Au or Cr/Au layer 30 filling the intervening strips. An unillustrated contact to the n+ layer 12 was accomplished by chemically etching down to the n+ layer 12 and depositing an AuGe/Au film.

Figure 2:
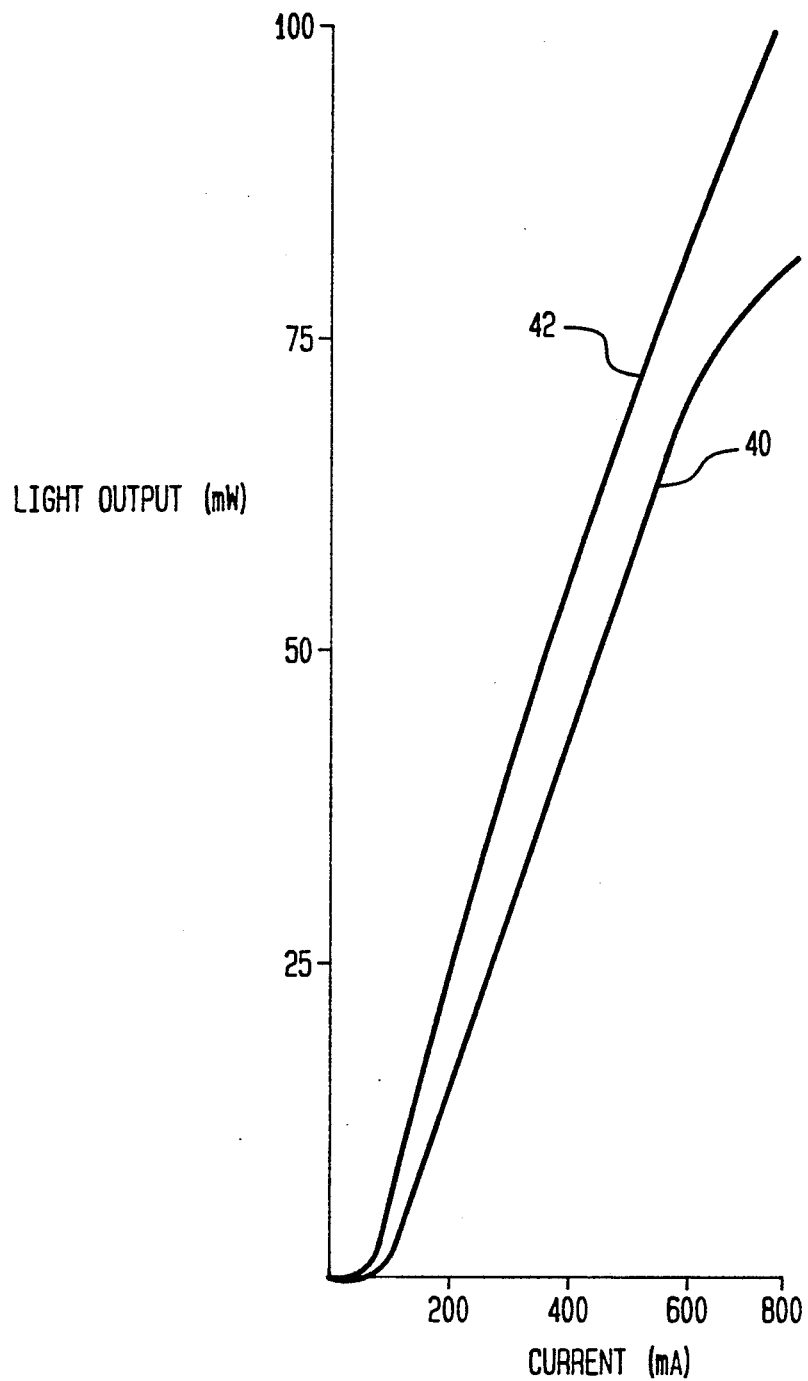
FIG. 2 is a graph of light vs. intensity for the embodiment of FIG. 1.

Light was emitted from the bottom of the substrate 10. The light intensity vs. current of a 4×4 array distributed over 40×40 μm² was measured and is illustrated by curve 40 in FIG. 2. For comparison, a 40×40 μm² broad-area laser with no reflectivity modulation was fabricated and tested. A comparison of its intensity vs. current curve 42 with that of the micro-laser array shows that the threshold current of 55 mA and efficiency of 14% for the reflectivity-modulated array are somewhat worse than the values of 50 mA and 16% for the broad-area laser. However, the broad-area laser showed severe filamentation already at 110% of the threshold current when its light intensity was measured in the near field. Its far-field pattern was broad and relatively featureless, indicating a lack of coherency across the broad-area laser.

In contrast, the near-field pattern for the loss-modulated laser array showed emission from each of its elements. The far-field patterns were highly featured, regular, and indicated a completely phase-locked emission from the elements. For two-dimensional rectangular arrays, the array always appeared to be in the highest-order supermode, i.e., the anti-phase supermode. That is, although all the elements were phase-locked, any element was 180° out of phase with its up to four neighboring elements. The far-field pattern for the highest-order supermode is a 2×2 angularly distributed beam array for any size of rectangular array of coherent lasers. This pattern was observed for a wide variety of rectangular arrays, up to a 25×25 array over an area of 250×250 $\mu m^2$.

Figure 3:
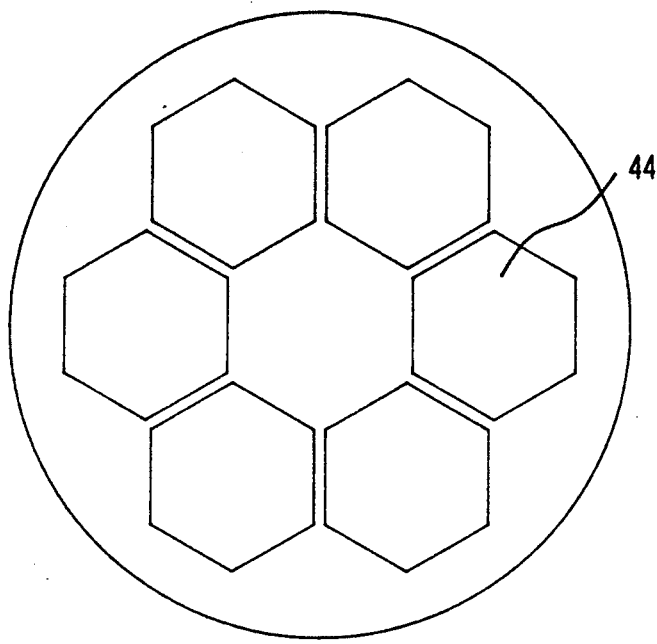
FIGS. 3 and 4 are plan views of further arrangements of phase-locked lasers.
Figure 4:
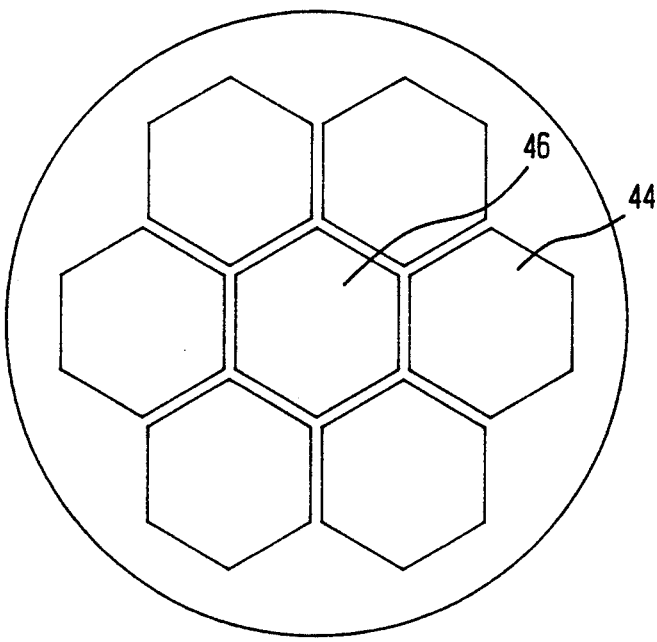

The above process was also used to fabricate various array configurations, one of which was a hexagonal array of lasers similar to one suggested in the Yoo et al. article. As illustrated in plan view in FIG. 3, six lasers 44 having a generally hexagonal shape were arranged in the shape of an empty hexagon or ring. This represented the minimum even number 2N of lasers arranged in an empty circular ring. The lasers 44 were spaced on 10 $\mu m$ centers, and neighbors were separated by a strip of lower reflectivity of width 2 $\mu m$. On testing, the near-field pattern for the six-laser ring showed emission from all elements. The far-field pattern showed a six-beam pattern, which indicates anti-phase locking between neighboring elements. These results demonstrated the feasibility of fan-out to 2N far-field lobes from circular arrays with 2N elements. Yet another array, illustrated in plan view in FIG. 4, was fabricated that differed by the addition of a central laser 46 so that seven lasers were formed in an hexagonal close-packed array. Its near-field pattern showed emission from all lasers 44 and 46. However, the intensity of the central laser was substantially brighter. The far-field pattern showed a hollow-ring structure. Such a pattern is consistent with the hexagonal-ring lasers 44 being phase locked with 0° difference between them, but the central laser 46 being 180° out of phase. Such a result is not unexpected since the close-packed structure does not allow a 180° phase difference between all neighboring lasers 44 and 46. A comparison of these two results shows that a far-field intensity pattern can be controlled by isolating the lasers 44 and 46 and then separately contacting and selectively activating the central laser 46. The electrical isolation can be achieved by extending the duration of the ion beam milling of the gold layer 24 in forming the grid pattern so that it also removed the p+ GaAs layer on the top of the top mirror stack and not filling the milled strips with a conductor. Related control of intensity patterns was demonstrated with a three-element linear array. The far-field intensity pattern changed between activation of: (1) a single laser, (2) two neighboring lasers, (3) the two outside lasers, and (4) all three lasers.

Some of the work underlying the present invention has been disclosed by Orenstein et al. in "Phase Locking of Two-Dimensional Vertical Cavity Semiconductor Laser Arrays with Dynamic Mode Control," Technical Digest of CLEO 1990, Postdeadline paper CPDP29-1, pages 665-666, in "Effects of Array Geometry on the Supermodes of 2-Dimensional Vertical Cavity Semiconductor Laser Arrays," Technical Digest of the LEOS 1990 Annual Meeting, Boston, Mass., paper SDL1.2/MKK7, and in "Planar 2-dimensional arrays of coherently locked vertical cavity surface emitting InGaAs/GaAs laserlet arrays," Program: 48th Annual Device Reserach Conference, June 25-27, 1990, paper VIIIA-4.

The embodiment of FIG. 1 relied upon a differential reflectivity of the metal part of the upper mirror. There are other methods for laterally varying the mirror reflectivity. A photoresist mask patterned into a grid over the gold layer 24 of FIG. 1 could be used to mask a relatively shallow ion implantation performed through the gold layer 24. The implantation can amorphise or simply mix constituents of portions of the upper mirror. Thereby, the refractive indices are changed, and the quarter-wavelength structure in the upper mirror is degraded with a loss of the reflectivity in that portion.

The ability to define the elements in the phase-locked arrays by relatively small patterned changes in the mirror reflectivity relies on the fact that the single-pass gain in these structures is very small. They thus require high reflectivities in the end mirrors, above 99%. Hence, a slight controlled lateral variation of the cavity finesse can define the area. In contrast, filamentation probably results from slight, inadvertent nonuniformities in the cavity finesse caused by variations in the composition or layer thickness across the laser area. If filamentation is to be suppressed, the controlled variations in reflectivity need to be larger in amplitude than the inadvertent variations.

Phase-locking is promoted in the loss-modulated arrays because of the lack of index guiding in the individual lasers. Therefore, there is strong diffraction spreading from the highly reflective portions of the mirrors which operates to spread the optical modes between neighboring lasers. As a result, phase locking can be achieved with relatively large laser separation available with conventional processing in contrast to the 100 nm laser separation required by Yoo et al. to achieve phase locking.

The ability to phase lock an array of lasers is required if the array is to produce steerable beam by introducing a controlled amount of phase difference between the lasers of the array.

The four-beam far-field pattern produced by the rectangular arrays of the embodiment of FIG. 1 would be useful when 4-to-1 fan-out is required. On the other hand, one method to convert the anti-phase supermode to the fundamental mode is to use a phase mask similar to one described by Taneya et al. in "Stable quasi 0° phase mode operation in a laser array diode nearly aligned with a phase shifter," Applied Physics Letters, volume 50, 1987, pages 783-785. The substrate 10 must be thin enough to place its back within the near field of the lasers. A 180° phase-mask array is then formed on the substrate back in registry with the lasers. That is, the optical distance introduced by the phase mask differs by $\lambda/2$ between neighboring elements in the rectangular array. Thereby, 180° is added to the phase of alternate elements, bringing all the elements into phase.

The invention thus provides an simple method of defining an array of vertical-cavity, surface-emitting lasers. The method is particularly useful when it is desired that the lasers within the array be phase locked.

What is claimed is:

1. In an array of lasers, an optical structure comprising:
   a crystalline substrate;
   a lower interference mirror epitaxially formed on said substrate and comprising a plurality of pairs of layers of differing refractive indices and of optical thickness $\lambda/4$;
   an active layer epitaxially formed over said lower mirror and emitting at a wavelength equal to $\lambda$;
   an upper interference mirror formed over said active layer and comprising a plurality of pairs of layers of differing refractive indices and of optical thickness $\lambda/4$, a optical distance between said upper and lower interference mirrors having a predetermined relationship to $\lambda$; and
   a laterally arranged array of reflectively differing portions, comprising first portions of higher reflectivity and second portions of lower reflectivity, formed on said upper interference mirror with said second portions of lesser reflectivity electrically coupling said first portions of higher reflectivity.

2. An optical structure as recited in claim 1, wherein said array of reflectively differing portions comprises
   a laterally arranged array of metallic reflectors formed over said upper interference mirror, wherein said lower interference mirror, said active layer, and a major portion of said upper interference mirror are laterally unpatterned below said array of metallic reflectors.

3. An optical structure as recited in claim 2, further comprising a conductive metal of lower reflectivity than said metallic reflectors formed between elements of said array of said metallic reflectors.

4. An optical structure as recited in claim 2, further comprising a plurality of electrical contacts connected to respective ones of said metallic reflectors.

5. An optical structure array of lasers as recited in claim 11, wherein said lower and upper interference mirrors and said active layer produce an array of laser elements laterally defined by said reflectively differing portions, neighboring ones of said laser elements being sufficiently optically coupled across said portions of lesser reflectivity that said array of laser elements are capable of emitting light conherently between them.

6. An optical structure as recited in claim 1, wherein said reflectively differing portions are arranged in a repeating structure.

7. An optical structure as recited in claim 6, wherein said repeating structure is a linear array.

8. An optical structure as recited in claim 1, wherein said reflectively differing portions define an array of laser elements and further comprising separate electrodes attached to respective ones of said laser elements.

9. In an array of lasers, an optical structure comprising:
   a crystalline substrate;
   a lower interference mirror epitaxially formed on said substrate and comprising a plurality of pairs of layers of differing refractive indices and of optical thickness $\lambda/4$;
   an active layer epitaxially formed over said lower mirror and emitting at a wavelength equal to $\lambda$;
   an upper interference mirror formed over said active layer and comprising a plurality of pairs of layers of differing refractive indices and of optical thickness $\lambda/4$, a optical distance between said upper and lower interference mirrors having a predetermined relationship to $\lambda$; and
   a laterally arranged array of reflectively differing portions formed on said upper interference mirror with portions of lesser reflectivity formed therebetween, wherein said laterally arranged array is a repeating structure of a circularly arranged array closed upon itself and having 2N laser elements laterally defined by said reflectively differing portions, $N>2$.

10. An optical structure as recited in claim 9, wherein $N=3$, and further comprising another laser element defined by said reflectively differing portions disposed within said circularly arranged array, all of said laser elements having hexagonal shapes.

11. An optical structure as recited in claim 9, wherein said reflectively differing portions are electrically connected.

12. In an array of lasers, an optical structure comprising:
   a crystalline substrate;
   a laterally undefined structure formed on said substrate including a lower interference mirror, an active region, and an upper interference mirror, said active region capable of emitting light of a wavelength under electrical excitation, said upper and lower interference mirrors being separated by an optical distance related to said wavelength; and
   an array of highly reflective metallic portions formed on said laterally undefined structure and separated by portions of lower reflectivity, whereby resonant cavities are formed for light of said wavelength beneath respective ones of said metallic portions, neighboring ones of said metallic portions being separated by a sufficiently small distance such that light in said resonant cavities beneath said neighboring metallic portions is phase locked.

* * * * *

UNITED STATES PATENT AND TRADEMARK OFFICE
CERTIFICATE OF CORRECTION

PATENT NO. : 5,086,430

DATED : February 4, 1992

INVENTOR(S) : Elyahou Kapon and Meir Orenstein

It is certified that error appears in the above-identified patent and that said Letters Patent is hereby corrected as shown below:

Column 7, line 46, "conherently" should read --coherently--.
       line 40, claim 5 "11" should read --1--.

Signed and Sealed this

Eighth Day of June, 1993

Attest:

MICHAEL K. KIRK

*Attesting Officer*      *Acting Commissioner of Patents and Trademarks*